(12) United States Patent
Sertel et al.

(10) Patent No.: US 11,190,282 B2
(45) Date of Patent: Nov. 30, 2021

(54) METHODS FOR ANTENNA PATTERN CHARACTERIZATION BASED ON COMPRESSIVE SENSING

(71) Applicant: Ohio State Innovation Foundation, Columbus, OH (US)

(72) Inventors: Kubilay Sertel, Columbus, OH (US); Niru Nahar, Columbus, OH (US); Syed An Nazmus Saqueb, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 307 days.

(21) Appl. No.: 16/529,180

(22) Filed: Aug. 1, 2019

(65) Prior Publication Data
US 2021/0281329 A1 Sep. 9, 2021

Related U.S. Application Data

(60) Provisional application No. 62/713,035, filed on Aug. 1, 2018.

(51) Int. Cl.
*G01R 29/10* (2006.01)
*H04B 3/46* (2015.01)
(Continued)

(52) U.S. Cl.
CPC .......... *H04B 17/102* (2015.01); *G01R 29/10* (2013.01); *H04B 17/0085* (2013.01); *H04B 17/12* (2015.01); *H04B 17/16* (2015.01)

(58) Field of Classification Search
CPC .. H04B 17/102; H04B 17/12; H04B 17/0085; H04B 17/16; G01R 29/10
(Continued)

(56) References Cited

U.S. PATENT DOCUMENTS 6,507,312 B1 * 1/2003 Fredericks ............ G01S 7/4052
342/173
7,408,507 B1 * 8/2008 Paek ...................... H01Q 1/405
342/368

(Continued)

OTHER PUBLICATIONS

Gordon et al. "Millimeter-Wave Near-Field Measurements Using Coordinated Robotics." IEEE Transactions on Antennas and Propagation, vol. 63, No. 12, pp. 5351-5362, Dec. 2015.
(Continued)

*Primary Examiner* — Don N Vo
(74) *Attorney, Agent, or Firm* — Meunier Carlin & Curfman LLC

(57) ABSTRACT

Example systems and methods for antenna pattern characterization are described herein. The systems and methods are based on compressive sensing. An example method can include arranging a test antenna and a probe antenna in a spaced apart relationship; arranging a spatial light modulator within in a near field region of the test antenna; and projecting, using a light source, a plurality of light patterns onto the spatial light modulator. The method can also include transmitting, using the test antenna, a respective beam while each of the light patterns is projected onto the spatial light modulator; and receiving, using the probe antenna, a respective signal corresponding to each of the respective beams transmitted by the test antenna. The method can further include reconstructing the test antenna's near field using the respective signals received by the probe antenna. The test antenna's near field can be reconstructed using a compressive sensing algorithm.

20 Claims, 5 Drawing Sheets

(51) Int. Cl.
*H04B 17/10* (2015.01)
*H04B 17/00* (2015.01)
*H04B 17/12* (2015.01)
*H04B 17/16* (2015.01)

(58) Field of Classification Search
USPC .......................................... 343/703; 375/224
See application file for complete search history.

(56) References Cited

U.S. PATENT DOCUMENTS

| | | | |
|---|---|---|---|
| 8,901,497 B2 * | 12/2014 | Sartorius | G01N 21/3581 |
| | | | 250/338.4 |
| 10,630,391 B1 * | 4/2020 | LaGasse | H04B 10/548 |
| 2002/0036491 A1 * | 3/2002 | Whitaker | G01R 29/14 |
| | | | 324/96 |

OTHER PUBLICATIONS

Johansson et al. "The diagonal horn as a sub-millimeter wave antenna." IEEE Transactions on Microwave Theory and Techniques vol. 40, No. 5, pp. 795-800, 1992.

Newell, Allen C. "Error analysis techniques for planar near-field measurements." IEEE Transactions on Antennas and Propagation 36.6 (1998): 754-768.

Orovic et al., "Compressive Sensing in Signal Processing: Algorithms and Transform Domain Formulations", Mathematical Problems in Engineering 2016, Article ID 7616393, 16 pages.

Saqueb et al., "Single-bit compressing imaging system for the mmW and THz bands." 2017 IEEE International Symposium on Antennas and Propagation & USNC/URSI National Radio Science Meeting. IEEE, 2017, 843-844.

Saqueb et al., "Phase-Sensitive Single-Pixel THz Imaging Using Intensity-Only Measurements." IEEE Transactions on Terahertz Science and Technology, vol. 6, No. 6, Nov. 2016, 810-816.

Shams et al., "Characterization of terahertz antennas using photoinduced coded-aperture imaging." Microwave and Optical Technology Letters 57.5 (2015): 1180-1184.

Zhang et al. "Conjugated polymer-based broadband terahertz wave modulator." Optics letters vol. 39, No. 21, pp. 6110-6113, 2014.

* cited by examiner

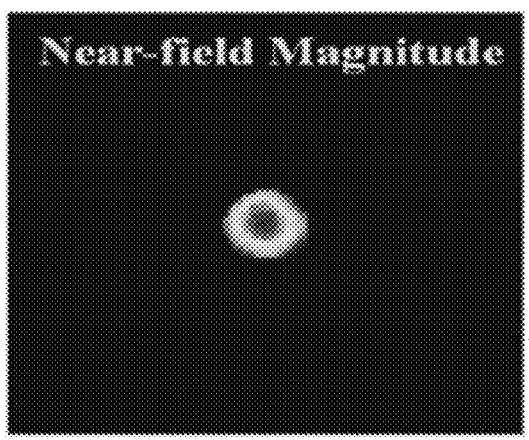
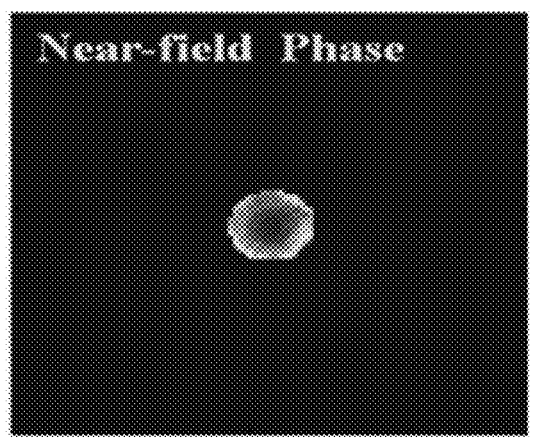
*FIG. 2A*  *FIG. 2B*
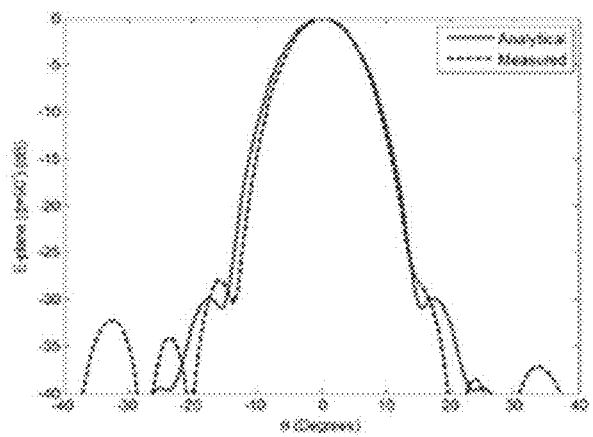
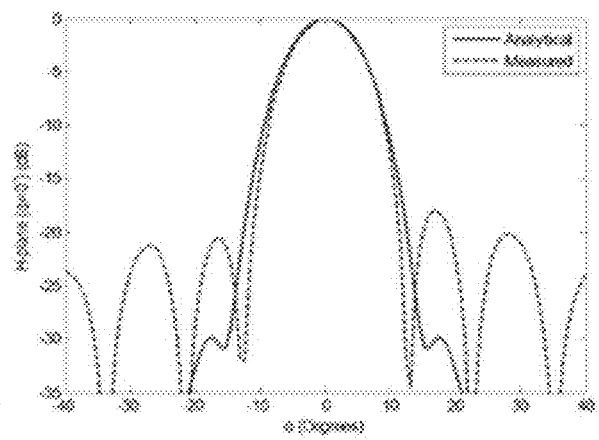
*FIG. 2C*  *FIG. 2D*

METHODS FOR ANTENNA PATTERN CHARACTERIZATION BASED ON COMPRESSIVE SENSING

CROSS-REFERENCE TO RELATED APPLICATIONS

This application claims the benefit of U.S. provisional patent application No. 62/713,035, filed on Aug. 1, 2018, and entitled "METHOD FOR ANTENNA PATTERN CHARACTERIZATION BASED ON COMPRESSIVE SENSING," the disclosure of which is expressly incorporated herein by reference in its entirety.

STATEMENT REGARDING FEDERALLY FUNDED RESEARCH

This invention was made with government support under Grant no. N00014-14-1-0810 awarded by the Office of Naval Research (ONR). The government has certain rights in the invention.

BACKGROUND

The traditional method of antenna far-field pattern measurement is to scan the near-field in a specific geometry using a probe antenna. The scanning system requires positioning of the probe antenna with an accuracy of $\lambda/100$ [1]. This becomes increasingly difficult with shorter wavelengths of millimeter-wave (mmW) and terahertz (THz). The National Institute of Standards and Technology (NIST) has developed a robotic arm scanning system for near-field measurement that works with high fidelity in 100-300 GHz band [2]. However, this robotic arm is a highly sophisticated and expensive system that has six-degree-of-freedom in the movement. Also, the large dimension of the arm is not suited for small on-chip antenna measurements.

SUMMARY

Example systems and methods for antenna pattern characterization are described herein. The systems and methods are based on phase-sensitive compressive imaging. An example method can include arranging a test antenna and a probe antenna in a spaced apart relationship; arranging a spatial light modulator within in a near field region of the test antenna; and projecting, using a light source, a plurality of light patterns onto the spatial light modulator. The method can also include transmitting, using the test antenna, a respective beam while each of the light patterns is projected onto the spatial light modulator; and receiving, using the probe antenna, a respective signal corresponding to each of the respective beams transmitted by the test antenna. The method can further include reconstructing the test antenna's near field using the respective signals received by the probe antenna. The test antenna's near field can be reconstructed using a compressive sensing algorithm.

Additionally, the test antenna and the probe antenna can be arranged in a fixed relationship.

Alternatively or additionally, the method can include maintaining the test antenna and the probe antenna in the fixed relationship while projecting each of the light patterns onto the spatial light modulator.

Alternatively or additionally, each of the light patterns can modulate one of the respective beams transmitted by the test antenna.

Alternatively or additionally, each of the light patterns can be a respective binary grid pixelated pattern.

Alternatively or additionally, the spatial light modulator can be a sheet of photoconductive material, for example, a silicon wafer.

Alternatively or additionally, the frequency of projected light can be equal to or greater than the bandgap of the photoconductive material.

Alternatively or additionally, the spatial light modulator can be arranged about 3 millimeters (mm) from the test antenna.

Alternatively or additionally, the respective beams transmitted by the test antenna can be millimeter-wave radiation or submillimeter-wave radiation.

An example system is also described herein. The system can include a probe antenna, a spatial light modulator arranged within in a near field region of a test antenna, a light source, and a control unit operably coupled to the probe antenna and the light source. The control unit can include a processor and a memory, and the control unit can be configured to cause the light source to project a plurality of light patterns onto the spatial light modulator; record a respective signal received by the probe antenna, each respective signal corresponding to a respective beam transmitted by the test antenna while each of the light patterns is projected onto the spatial light modulator; and reconstruct the test antenna's near field using the respective signals received by the probe antenna. The test antenna's near field can be reconstructed using a compressive sensing algorithm.

Additionally, the control unit can be further configured to randomly generate the plurality of light patterns.

In some implementations, the system can optionally include a reflecting element configured to reflect the respective beams transmitted by the test antenna toward the probe antenna and to pass the light patterns toward the spatial light modulator.

In some implementations, the system can optionally include the test antenna. Optionally, the test antenna can be a millimeter-wave antenna or a submillimeter-wave antenna.

It should be understood that the above-described subject matter may also be implemented as a computer-controlled apparatus, a computer process, a computing system, or an article of manufacture, such as a computer-readable storage medium.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIGS. 2A-2D illustrate the results of 128×128 reconstruction of the near-field of an example antenna (i.e., WR 1.5 horn at 684 GHz) according to the example described herein. FIG. 2A illustrates the near-field magnitude. FIG. 2B illustrates the near-field phase. FIG. 2C illustrates E-plane far-field patterns from analytical equation (solid line) and by transforming near-field pattern (dashed line). FIG. 2D illustrates H-plane far-field patterns from analytical equation (solid line) and by transforming near-field pattern (dashed line).

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for characterizing submillimeter-wave antennas (e.g., operating at terahertz (THz) frequencies), it will become evident to those skilled in the art that the implementations are not limited thereto, but are applicable for characterizing other antennas including, but not limited to, millimeter-wave antennas.

Figure 1:
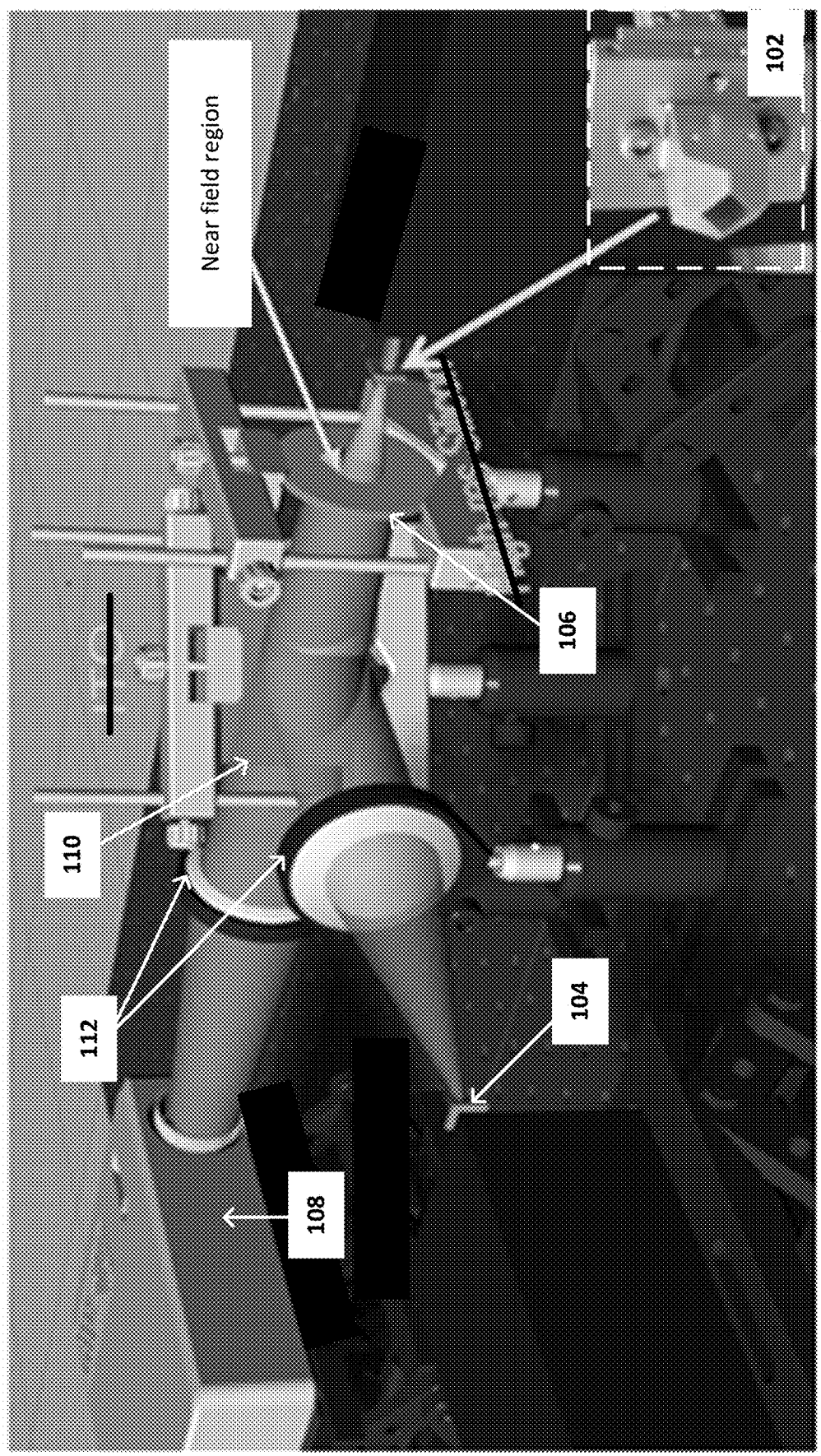
FIG. 1 is a diagram illustrating antenna pattern characterization using compressive sensing according to implementations described herein.

Referring now to FIG. 1, an example system for antenna pattern characterization is shown. The system can include a probe antenna 104 (also referred to herein as "detector"), a spatial light modulator 106 arranged within in a near field region of a test antenna 102 (also referred to herein as "source"), a light source 108, and a control unit operably coupled to the probe antenna 104 and the light source 108. This disclosure contemplates that the control unit can be the computing device of FIG. 3. The system described with regard to FIG. 1 can be used to characterize the near-field pattern of the test antenna 102 using compressive sensing techniques. In some implementations, the test antenna 102 can be a millimeter-wave antenna, e.g., an antenna configured to operate in a frequency band between about 30 gigahertz (GHz) and about 300 GHz. In other implementations, the test antenna 102 can be a submillimeter-wave antenna, e.g., an antenna configured to operate in the terahertz (THz) frequency range. This disclosure contemplates that such antennas can optionally be arranged on a semiconductor chip.

As described herein, it is difficult to characterize the near field of millimeter-wave and/or submillimeter wave antennas using conventional techniques, particularly due to the precise positioning control needed for small on-chip measurements. Antenna near fields must be sampled at intervals in the order of $1/100$ wavelength of interest. Although this is easily achievable for radiofrequency (RF) applications (e.g., at 10 GHz wavelength is about 3 cm), extremely precise position control is required for mmW and sub-mmW antennas where wavelengths of interest are on the order of microns. The mechanical positioning of the probe antenna can therefore become a limiting factor for mmW and sub-mmW antenna applications because high-accuracy robotic arms and/or laser-tracking systems are cost prohibitive. Accordingly, the systems and methods described herein use compressive sensing techniques.

Compressive sensing (CS) is a signal processing technique for efficiently acquiring and reconstructing a signal by solving undersampled linear systems. Using compressive sensing, the signal can be reconstructed using fewer samples than required by Nyquist-Shannon sampling theorem (e.g., sampling rate≥maximum signal frequency). Compressive sensing uses mathematical algorithms to solve the data reconstruction problem using fewer samples by taking advantage of the properties of sparsity and incoherence. It should be understood that an undersampled system of linear equations has more unknowns than equations and thus an infinite number of solutions. To solve such an undersampled system, extra constraints are imposed. For compressive sensing, the extra constraint is sparsity. Example compressive sensing algorithms include, but are not limited to, convex optimizations (e.g., basis pursuit denoising), greedy algorithms, soft/hard thresholding methods, adaptive gradient based methods, and combinations thereof (i.e., hybrid algorithms). For example, Orovic et al., *Compressive Sensing in Signal Processing: Algorithms and Transform Domain Formulations*, Mathematical Problems in Engineering (2016) describes example compressive sensing algorithms. Compressive sensing algorithms are known in the art and is therefore not described in further detail herein.

Additionally, the control unit described above can be operably coupled to the test antenna 102, the probe antenna 104, and/or the light source 108. The test antenna 102, the probe antenna 104, and/or the light source 108 discussed above can be coupled to the control unit through one or more communication links. This disclosure contemplates the communication links are any suitable communication link. For example, a communication link may be implemented by any medium that facilitates data exchange including, but not limited to, wired, wireless and optical links. Example communication links include, but are not limited to, a local area network (LAN), a wireless local area network (WLAN), a wide area network (WAN), a metropolitan area network (MAN), Ethernet, the Internet, or any other wired or wireless link such as WiFi, WiMax, 3G, 4G, or 5G.

The control unit can be configured to cause the light source 108 to project a plurality of light patterns onto the spatial light modulator 106, which is arranged within a near field region of the test antenna 102. In the example below, the spatial light modulator 106 is arranged 3 millimeters (mm) from the test antenna 102. It should be understood that 3 mm is provided only as an example. This disclosure contemplates that the spatial light modulator 106 can be arranged at other distances from the test antenna 102 so long as it is within the near-field region. In other words, the distance between the spatial light modulator 106 and the test antenna 102 is determined by the maximum near-field distance of the test antenna 102. The spatial light modulator 106 can be a sheet of photoconductive material. In the example below, the spatial light modulator 106 is a semiconductor (e.g., silicon) wafer. It should be understood that a silicon wafer is provided only as an example spatial light modulator. This disclosure contemplates that the spatial light modulator 106 can be a thin sheet of other photoconductive material. For example, organic polymers have been reported to produce similar optical modulation property in THz band (Zhang, Bo, et al. "Conjugated polymer-based broadband terahertz wave modulator." Optics letters 39.21 (2014): 6110-6113).

Figure 5:
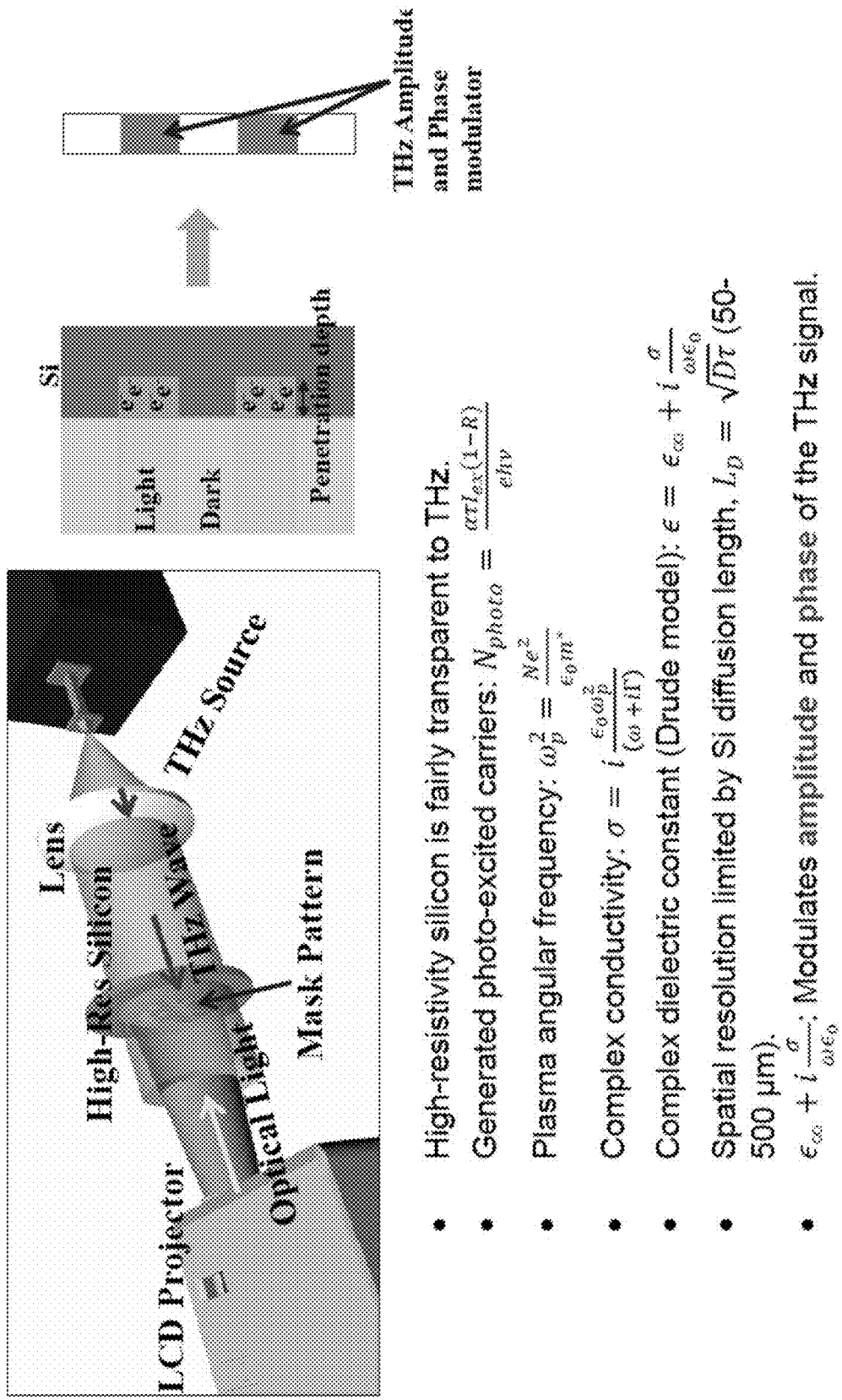
FIG. 5 is a diagram illustrating a compressive sensing mask implementation via photoexcitation of a photoconductive film (e.g., silicon).

The light source 108 can be a projector configured to produce optical excitation (e.g., light). In the example below, the projector emits white light (e.g., black and white pixelated patterns). The frequency of optical excitation can be equal to or greater than the bandgap of the photoconductive material. In the example below, the photoconductor material is silicon, so light that has energy greater than the bandgap of silicon will cause photoexcitation of silicon. In other words, the wavelength of the projected light has to be shorter than the silicon bandgap which is 1100 nanometers (nm). Optical light is in 400-750 nm wavelength band. Therefore, light of any color is sufficient for photoexcitation of silicon. It should be understood that the frequency of optical excitation can be selected to cause photoexcitation of the photoconductive material, which is not limited to silicon. It should also be understood that modulation depth is proportional to the intensity of the projected light. Additionally, the optical excitation can be a pixelated binary grid pattern (e.g., a black and white pixelated pattern). The pixelated binary grid patterns can be generated by the control unit, and in some implementations, the pixelated binary grid patterns can be randomly generated. In the unexcited state, the spatial light modulator 106 is fairly transparent to millimeter-wave and submillimeter-wave radiation. However, when a pixelated binary grid pattern is projected on the spatial light modulator 106, the light generates a photocarrier on the spatial light modulator 106 that blocks the radiation (see FIG. 5). Accordingly, the near field beam of the test antenna 102 can be modulated by projecting the pixelated binary grid patterns onto the spatial light modulator 106. As described below, the probe antenna 104 can receive a respective signal for each projected light pattern. In some implementations, the number of different projected light patterns is equal to the number of samples in the near field scan. For example, the number of different projected light patterns can optionally be ninety percent of the total number of measurements. For a 64×64-pixel reconstruction, the number of total pixels is 4,096. Using ninety percent, the number of projected light patterns used in the example below is ~3600. It should be understood that ninety percent of the total number of measurements is provided only as an example. This disclosure contemplates that the total number of measurements can be more or less than ninety percent of the total number of measurements.

Additionally, the control unit can be configured to record a respective signal received by the probe antenna 104, each respective signal corresponding to a respective beam transmitted by the test antenna 102 while each of the light patterns is projected onto the spatial light modulator 106. The probe antenna 104 can measure both magnitude and phase of the modulated signal (e.g., beam transmitted by the test antenna 102 as modulated by the light patterns projected onto the spatial light modulator 106). As shown in FIG. 1, the system can optionally include a reflecting element 110 configured to reflect the respective beams transmitted by the test antenna 102 toward the probe antenna 104 and to pass the light patterns toward the spatial light modulator 106. The reflecting element 110 can be optically transparent to light but reflective to millimeter-wave and submillimeter-wave radiation. For example, the reflecting element 110 can be indium-tin-oxide (ITO) coated glass. It should be understood that the ITO coated glass is provided only as an example. This disclosure contemplates using other materials that are optically transparent to light but reflective to radiation (e.g., THz radiation). In FIG. 1, the test antenna 102/spatial light modulator 106 and the light source 108 are arranged opposite each other, with the reflecting element 110 arranged therebetween. The light (e.g., the light patterns) can therefore pass through the reflecting element 110 such that the light patterns are projected on the spatial light modulator 106. On the other hand, the probe antenna 106 is arranged at an angle to the line-of-sight between the test antenna 102/spatial light modulator 106 and the light source 108. The reflecting element 110 can be used to reflect the radiation transmitted by the test antenna 102 toward the probe antenna 106. Optionally, as shown in FIG. 1, the system can include one or more lenses 112. The lenses 112 can be used to focus the light and/or radiation beams. Lenses that work in the THz frequency band are known in the art, for example, Teflon THz lenses from Thorlabs of Newton, N.J.

The control unit can be configured to reconstruct the test antenna's near field (e.g., both magnitude and phase) using the respective signals received by the probe antenna 104 and recorded by the control unit. As described herein, the test antenna's near field can be reconstructed using a compressive sensing algorithm. As described above, example compressive sensing algorithms include, but are not limited to, convex optimizations (e.g., basis pursuit denoising), greedy algorithms, soft/hard thresholding methods, adaptive gradient based methods, and combinations thereof (i.e., hybrid algorithms). This disclosure contemplates using a compressive sensing algorithm known in the art to reconstruct the test antenna's near field. Thereafter, the reconstructed near field can optionally be interpolated to achieve a higher resolution image. The near field image can be transformed to far field by integration.

It should be appreciated that the logical operations described herein with respect to the various figures may be implemented (1) as a sequence of computer implemented acts or program modules (i.e., software) running on a computing device (e.g., the computing device described in FIG. 3), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Figure 3:
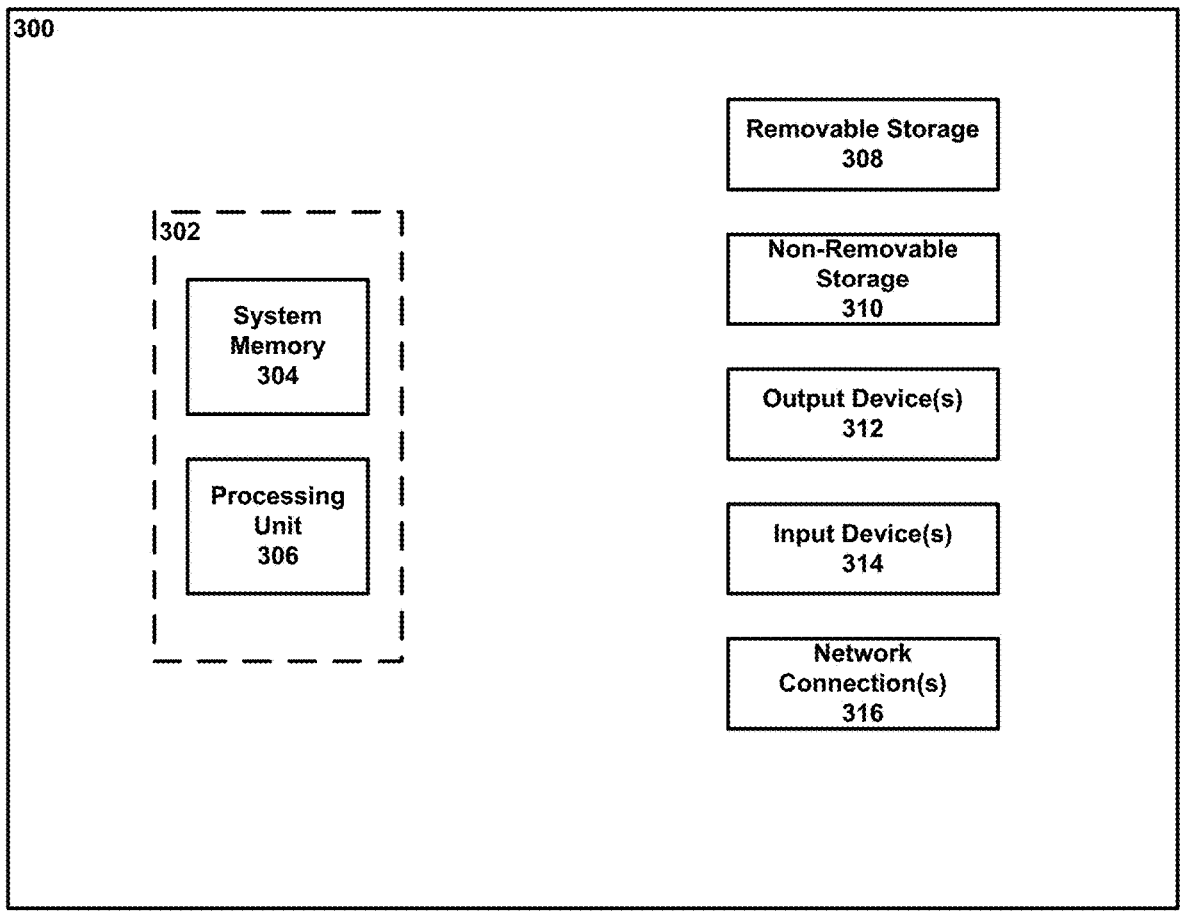
FIG. 3 is an example computing device.
Figure 4:
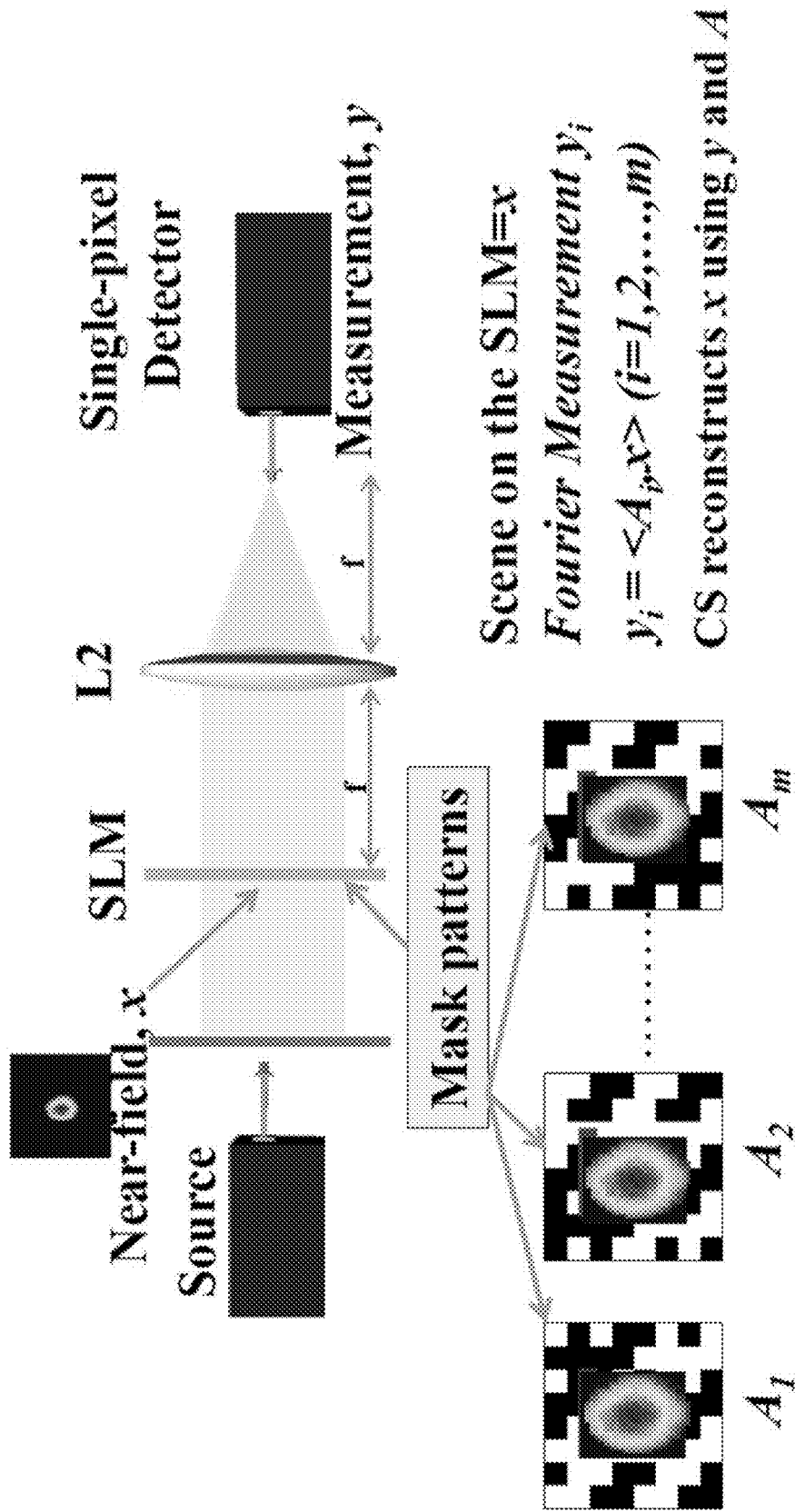
FIG. 4 is a diagram illustrating antenna pattern characterization using compressive sensing to obtain near field measurements.

Referring to FIG. 3, an example computing device 300 upon which the methods described herein may be implemented is illustrated. It should be understood that the example computing device 300 is only one example of a suitable computing environment upon which the methods described herein may be implemented. Optionally, the computing device 300 can be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In its most basic configuration, computing device 300 typically includes at least one processing unit 306 and system memory 304. Depending on the exact configuration and type of computing device, system memory 304 may be volatile (such as random access memory (RAM)), non-volatile (such as read-only memory (ROM), flash memory, etc.), or some combination of the two. This most basic configuration is illustrated in FIG. 3 by dashed line 302. The processing unit 306 may be a standard programmable processor that performs arithmetic and logic operations necessary for operation of the computing device 300. The computing device 300 may also include a bus or other communication mechanism for communicating information among various components of the computing device 300.

Computing device 300 may have additional features/functionality. For example, computing device 300 may include additional storage such as removable storage 308 and non-removable storage 310 including, but not limited to, magnetic or optical disks or tapes. Computing device 300 may also contain network connection(s) 316 that allow the device to communicate with other devices. Computing device 300 may also have input device(s) 314 such as a keyboard, mouse, touch screen, etc. Output device(s) 312 such as a display, speakers, printer, etc. may also be included. The additional devices may be connected to the bus in order to facilitate communication of data among the components of the computing device 300. All these devices are well known in the art and need not be discussed at length here.

The processing unit 306 may be configured to execute program code encoded in tangible, computer-readable media. Tangible, computer-readable media refers to any media that is capable of providing data that causes the computing device 300 (i.e., a machine) to operate in a particular fashion. Various computer-readable media may be utilized to provide instructions to the processing unit 306 for execution. Example tangible, computer-readable media may include, but is not limited to, volatile media, non-volatile media, removable media and non-removable media implemented in any method or technology for storage of information such as computer readable instructions, data structures, program modules or other data. System memory 304, removable storage 308, and non-removable storage 310 are all examples of tangible, computer storage media. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 306 may execute program code stored in the system memory 304. For example, the bus may carry data to the system memory 304, from which the processing unit 306 receives and executes instructions. The data received by the system memory 304 may optionally be stored on the removable storage 308 or the non-removable storage 310 before or after execution by the processing unit 306.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

An example method for antenna pattern characterization is described herein. This disclosure contemplates that the method can be performed using the system described with regard to FIG. 1. The method can include arranging a test antenna (e.g., test antenna 102 of FIG. 1) and a probe antenna (e.g., probe antenna 104 of FIG. 1) in a spaced apart relationship; arranging a spatial light modulator (e.g., spatial light modulator 106 of FIG. 1) within in a near field region of the test antenna; and projecting, using a light source (e.g., light source 108 of FIG. 1), a plurality of light patterns onto the spatial light modulator. The method can also include transmitting, using the test antenna, a respective beam while each of the light patterns is projected onto the spatial light modulator; and receiving, using the probe antenna, a respective signal (e.g., the modulated beam) corresponding to each of the respective beams transmitted by the test antenna. The method can further include reconstructing the test antenna's near field using the respective signals received by the probe antenna. The test antenna's near field can be reconstructed using a compressive sensing algorithm.

As described herein, the test antenna and the probe antenna can be arranged in a fixed relationship. Additionally, the method can include maintaining the test antenna and the probe antenna in the fixed relationship while projecting each of the light patterns onto the spatial light modulator. In other words, the systems and methods described herein can eliminate the mechanical motion (which requires precise control) between the test and probe antennas during the near field scanning process. This makes the systems and methods scalable to mmW and sub-mmW applications.

EXAMPLES

Compressive imaging with complex measurements can be used for the reconstruction of the near-field wavefront. The near-field can be propagated to far-field to extract the pattern.

The example system described below has no moving elements and can work in a broad range of frequencies. The quasi-optical setup can be modified to fit in a small space to make it suitable for on-chip antenna characterization. Measuring the near-field and transforming it to far-field, improvement in measurement accuracy has been demonstrated down to −30 dB with minimal error in the first side lobe for E-plane pattern.

In earlier work [3], it was demonstrated that compressive sensing (CS) imaging technique can reconstruct the wavefront by recording both magnitude and phase of the modulated signal. Therefore, this technique, which has no moving element and can work in a broad range of frequency, can be employed for antenna near-field measurement. This would be an ideal replacement of the robotic arm system for mmW/THz antenna characterization developed by NIST. For initial demonstration, Virginia Diode's WR 1.5 horn antenna has been characterized at 684 GHz. The experimental setup is shown in FIG. 1.

The setup is similar to the CS setup used for imaging [3] except the object is removed and the source antenna (also referred to herein as "test antenna") is brought closer to the spatial light modulator (SLM). Thus, the reconstructed CS image is the 2-D mapping of the near-field wave of the antenna. A pair of Virginia Diode, Inc's frequency extender modules in WR1.5 band (500-750 GHz) connected to a Keysight Vector Network Analyzer (N5242A) were used as source antenna and detector (also referred to herein as "probe antenna"), respectively. The source antenna is to be characterized and is placed in front of a high resistivity silicon wafer which acts as a spatial light modulator (SLM). The distance from the source antenna to the SLM was 3 mm. The THz near-field beam transmits through the silicon wafer and is then reflected by an indium-tin oxide (ITO) coated glass. This ITO glass reflects the THz wave, however, is transparent to optical light. The unexcited wafer is fairly transparent to THz wave. A commercial liquid crystal display (LCD) projector was used to illuminate it with computer generated binary grid patterns form the backside of the incident THz beam. The optical light from the projector generates photocarrier on the wafer which blocks the THz wave. Therefore, projecting black and white pixelated patterns, spatial modulation of the THz near field beam is controlled. The modulated beam is reflected by the ITO glass and focused towards the detector by a lens. The detector records modulated signal of the 2D near-field on the wafer. By recording a series of randomly modulated signal, compressive sensing algorithm can be applied to reconstruct both magnitude and phase of the 2D near-field. Note that the detector is a heterodyne detection system, and both magnitude and phase of the modulated signal (complex-valued measurements) are recorded.

A 64×64-pixel complex image of the near-field beam recording 90% complex-valued measurements at 684 GHz was recorded. Then the reconstructed near-field is interpolated to higher resolution (128×128-pixel), and the interpolated near-field is transformed to far-field by integration. The experimental and analytical [4] far-field E-plane are plotted in the same figure, as shown in FIGS. 2A-2D. As shown, the main lobes match very well and the 3 dB beamwidth values from data-sheet, analytical formula and experiment are 10°, 10.4° and 9.8° respectively.

REFERENCES

[1] Newell, Allen C. "Error analysis techniques for planar near-field measurements." IEEE Transactions on Antennas and Propagation 36.6 (1988): 754-768.

[2] Gordon, Joshua A., et al. "Millimeter-wave near-field measurements using coordinated robotics." IEEE Transactions on Antennas and Propagation 63.12 (2015): 5351-5362.

[3] Saqueb, Syed An Nazmus, and Kubilay Sertel. "Phase-sensitive single-pixel THz imaging using intensity-only measurements." IEEE Transactions on Terahertz Science and Technology 6.6 (2016): 810-816.

[4] Johansson, Joakim F., and Nicholas D. Whyborn. "The diagonal horn as a sub-millimeter wave antenna." IEEE Transactions on Microwave Theory and Techniques 40.5 (1992): 795-800.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for antenna pattern characterization, comprising:
    arranging a test antenna and a probe antenna in a spaced apart relationship;
    arranging a spatial light modulator within in a near field region of the test antenna;
    projecting, using a light source, a plurality of light patterns onto the spatial light modulator;
    transmitting, using the test antenna, a respective beam while each of the light patterns is projected onto the spatial light modulator;
    receiving, using the probe antenna, a respective signal corresponding to each of the respective beams transmitted by the test antenna; and
    reconstructing the test antenna's near field using the respective signals received by the probe antenna, wherein the test antenna's near field is reconstructed using a compressive sensing algorithm.

2. The method of claim 1, wherein the test antenna and the probe antenna are arranged in a fixed relationship.

3. The method of claim 2, further comprising maintaining the test antenna and the probe antenna in the fixed relationship while projecting each of the light patterns onto the spatial light modulator.

4. The method of claim 1, wherein each of the light patterns modulates one of the respective beams transmitted by the test antenna.

5. The method of claim 1, wherein each of the light patterns is a respective binary grid pixelated pattern.

6. The method of claim 1, wherein the spatial light modulator is a sheet of photoconductive material.

7. The method of claim 6, wherein the spatial light modulator is a silicon wafer.

8. The method of claim 6, wherein the frequency of projected light is equal to or greater than the bandgap of the photoconductive material.

9. The method of claim 1, wherein the spatial light modulator is arranged about 3 millimeters (mm) from the test antenna.

10. The method of claim 1, wherein the respective beams transmitted by the test antenna are millimeter-wave radiation or submillimeter-wave radiation.

11. A system for antenna pattern characterization, comprising:
a probe antenna;
a spatial light modulator arranged within in a near field region of a test antenna;
a light source; and
a control unit operably coupled to the probe antenna and the light source, wherein the control unit comprises a processor and a memory, the memory having computer-executable instructions stored thereon that, when executed by the processor, cause the control unit to:
cause the light source to project a plurality of light patterns onto the spatial light modulator;
record a respective signal received by the probe antenna, each respective signal corresponding to a respective beam transmitted by the test antenna while each of the light patterns is projected onto the spatial light modulator; and
reconstruct the test antenna's near field using the respective signals received by the probe antenna, wherein the test antenna's near field is reconstructed using a compressive sensing algorithm.

12. The system of claim 11, wherein the test antenna and the probe antenna are arranged in a fixed relationship.

13. The system of claim 11, wherein each of the light patterns modulates one of the respective beams transmitted by the test antenna.

14. The system of claim 11, wherein each of the light patterns is a respective binary grid pixelated pattern.

15. The system of claim 11, wherein the memory has further computer-executable instructions stored thereon that, when executed by the processor, cause the control unit to randomly generate the plurality of light patterns.

16. The system of claim 11, wherein the spatial light modulator is a sheet of photoconductive material.

17. The system of claim 16, wherein the spatial light modulator is a silicon wafer.

18. The system of claim 11, further comprising a reflecting element configured to reflect the respective beams transmitted by the test antenna toward the probe antenna and to pass the light patterns toward the spatial light modulator.

19. The system of claim 11, further comprising the test antenna, wherein the control unit is operably coupled to the test antenna, and wherein the memory has further computer-executable instructions stored thereon that, when executed by the processor, cause the control unit to cause the test antenna to transmit a respective beam while each of the light patterns is projected onto the spatial light modulator.

20. The system of claim 19, wherein the test antenna is a millimeter-wave antenna or a submillimeter-wave antenna.

* * * * *